US 9,151,126 B2

(12) United States Patent
Jiang et al.

(10) Patent No.: US 9,151,126 B2
(45) Date of Patent: Oct. 6, 2015

(54) SYSTEM, METHOD AND COMPUTER PROGRAM PRODUCT TO SIMULATE DRILLING EVENT SCENARIOS

(75) Inventors: Jun Jiang, Austin, TX (US); Max Orland Duncan, Humble, TX (US); Yongfeng Kang, Katy, TX (US); Adolfo C. Gonzales, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 329 days.

(21) Appl. No.: 13/546,571

(22) Filed: Jul. 11, 2012

(65) Prior Publication Data

US 2014/0019106 A1  Jan. 16, 2014

(51) Int. Cl.
*E21B 21/08* (2006.01)
*G05B 13/04* (2006.01)

(52) U.S. Cl.
CPC .............. *E21B 21/08* (2013.01); *G05B 13/04* (2013.01)

(58) Field of Classification Search
CPC .............. E21B 4/00; E21B 4/02; E21B 7/00; E21B 7/04; E21B 7/08; E21B 7/12; E21B 10/42; E21B 19/00; E21B 17/00; E21B 17/10; E21B 28/00; E21B 33/038; E21B 33/06; E21B 33/064; E21B 34/06; E21B 43/00; E21B 43/12; E21B 434/16; E21B 44/00; E21B 44/02; E21B 47/00; E21B 49/08; F04C 2/107; G05B 13/04; G01V 11/00; G01V 3/18; G01V 9/00; G01V 9/02; G01V 1/40; C09K 8/34; C09K 8/02; G06G 7/48; G06G 7/64; G06F 19/00; G06F 7/544; G06F 17/10; G06F 17/11
USPC ............... 703/2, 10; 700/275; 175/24, 48, 57; 702/6; 507/100; 166/308.1
See application file for complete search history.

(56) References Cited

U.S. PATENT DOCUMENTS

| 7,650,950 | B2* | 1/2010 | Leuchtenberg ................. 175/48 |
| 2009/0084545 | A1 | 4/2009 | Banerjee et al. |
| 2009/0194330 | A1* | 8/2009 | Gray .............................. 175/24 |
| 2010/0314118 | A1* | 12/2010 | Quintero et al. ........... 166/308.1 |
| 2011/0266056 | A1 | 11/2011 | Pop et al. |
| 2012/0059521 | A1* | 3/2012 | Iversen et al. ................. 700/275 |
| 2012/0094876 | A1* | 4/2012 | Jamison et al. ............... 507/100 |
| 2012/0203525 | A1* | 8/2012 | Rodriguez Herrera et al. .. 703/2 |
| 2014/0012506 | A1* | 1/2014 | Adsit ............................... 702/6 |
| 2014/0034390 | A1* | 2/2014 | Mitchell et al. ................. 175/57 |

OTHER PUBLICATIONS

Aasen et al. ("Multistring analysis of wellhead movement", Journal of Petroleum Science and Engineering, 2009.*
Halal, et al., Casing Design for Trapped Annular Pressure Buildup, SPE Drilling & Completion, Jun. 1994, pp. 107-114.
Preliminary Report on Patentability, Jan. 22, 2015, PCT/US2013/050111, 6 pages, International Searching Authority, US.
Pattillo, et al., Analysis of an Annular Pressure Buildup Failure During Drill Ahead, Drilling and Completion, Dec. 2006, pp. 242-247.

* cited by examiner

*Primary Examiner* — Kandasamy Thangavelu
(74) *Attorney, Agent, or Firm* — Haynes and Boone, LLP

(57) ABSTRACT

Systems and related methods to simulate trapped annular pressure and wellhead movement during downhole drilling scenarios.

23 Claims, 8 Drawing Sheets

Full well configuration

Partial well configuration

MultiString Annular Fluid Expansion Summary Drill 8 1/2" Hole — 500A

| | String Annulus | Region | Incremental AFE Pressure (1) (psi) | Incremental AFE Volume (2) (bbl) |
|---|---|---|---|---|
| 1 | 20" Surface Casing | Region 1 | 2257.00 | 0.5 |
| 2 | 13 3/8" Intermediate Casing | Region 1 | 7334.00 | 63.3 |
| 3 | 9 5/8" Protective Casing | Region 1 | 9081.00 | 22.4 |
| 4 | | | | |
| 5 | (1) Pressure change caused solely by the Annular Fluid Expansion (AFE) phenomenon | | | |
| 6 | (2) Volume change caused solely by the Annular Fluid Expansion (AFE) effect | | | |

MultiString Wellhead Movement Displacement Summary Drill 8 1/2" Hole

| | Load | Displacement | |
|---|---|---|---|
| | | Incremental (ft) | Cumulative (ft) |
| 1 | Primary Cementing - 20in Surface Casing | 0.00 | 0.00 |
| 2 | Primary Cementing - 13 3/8in Intermediate Casing | -0.05 | -0.06 |
| 3 | Primary Cementing - 9 5/8in Protective Casing | -0.02 | -0.07 |
| 4 | Tubingless - 9 5/8in Protective Casing | 0.21 | 0.14 |

Fig. 5A

Partial well configuration ional constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the invention will become apparent from consideration of the following description and drawings.

SYSTEM, METHOD AND COMPUTER PROGRAM PRODUCT TO SIMULATE DRILLING EVENT SCENARIOS

FIELD OF THE INVENTION

The present invention generally relates to downhole simulators and, more specifically, to a system for simulating trapped annular pressure and wellhead movement during downhole drilling event scenarios.

BACKGROUND

The existence of trapped annular pressure and wellhead movement caused by production temperatures is known in the industry. Conventionally, analysts have either hand calculated the increase in trapped annular pressure caused by production temperatures, or used spreadsheets or other calculation algorithms to guess at a result. However, none of these efforts provide the needed quality assurance for such sophisticated calculations. Moreover, these approaches focused on production events, thereby entirely ignoring the effects that downhole temperatures and pressures have on the well during drilling operations.

Accordingly, in view of the foregoing shortcomings, there is a need in the art for a systematic workflow methodology that predicts and/or determines the effect that temperatures and pressures have on trapped annular pressure and wellhead movement during drilling operations.

BRIEF DESCRIPTION OF THE DRAWINGS

FIG. 5A illustrates a tabular multi-string annular fluid expansion summary produced according to an exemplary embodiment of the present invention.

DESCRIPTION OF ILLUSTRATIVE EMBODIMENTS

Illustrative embodiments and related methodologies of the present invention are described below as they might be employed in a system for simulating trapped annular pressure and wellhead movement during downhole scenarios. In the interest of clarity, not all features of an actual implementation or methodology are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the invention will become apparent from consideration of the following description and drawings.

Figure 1:
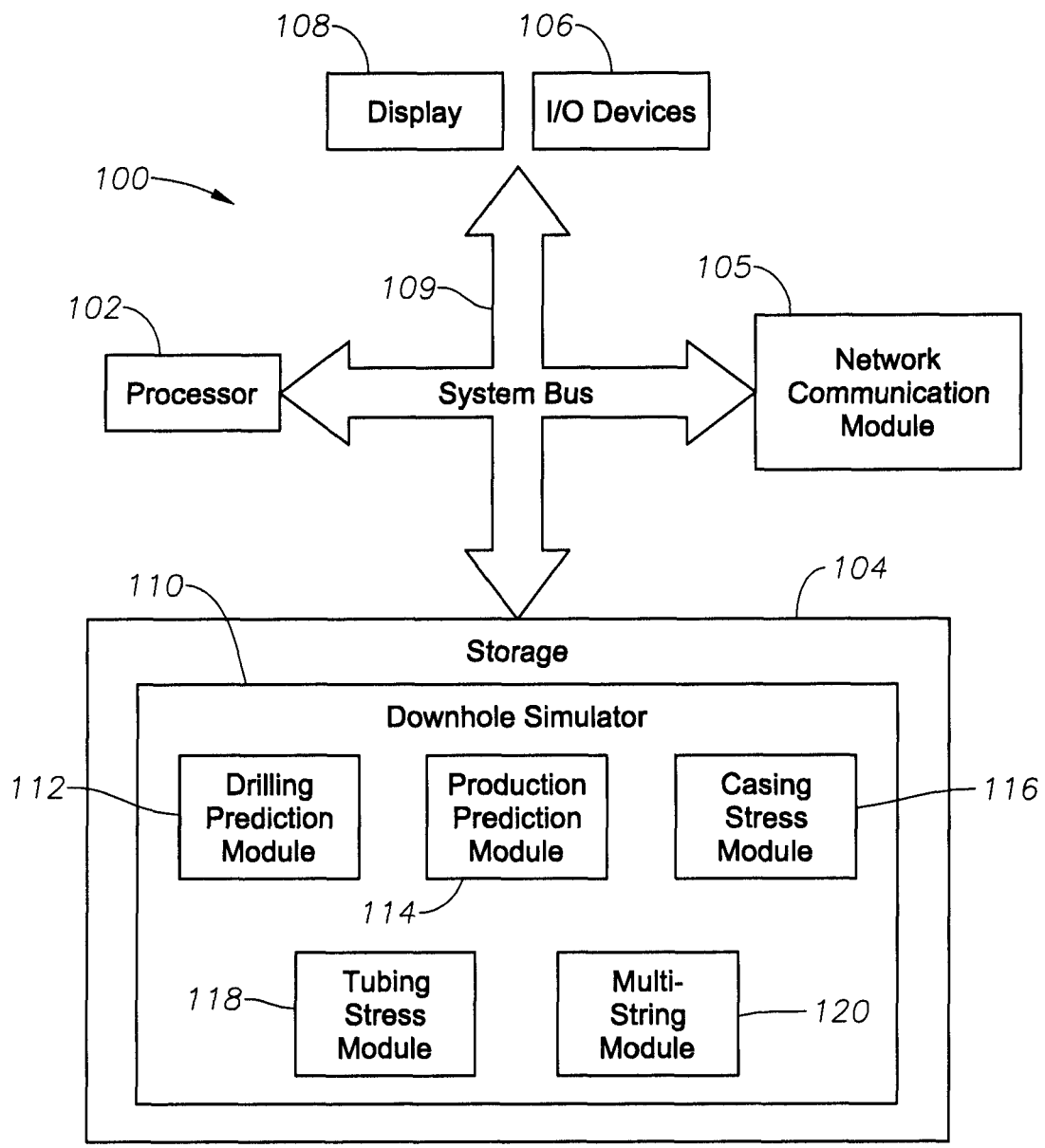
FIG. 1 illustrates a block diagram of a downhole simulation system according to an exemplary embodiment of the present invention.

FIG. 1 shows a block diagram of downhole simulation system 100 according to an exemplary embodiment of the present invention. In one embodiment, downhole simulation system 100 includes at least one processor 102, a non-transitory, computer-readable storage 104, transceiver/network communication module 105, optional I/O devices 106, and an optional display 108, all interconnected via a system bus 109. Software instructions executable by the processor 102 for implementing software instructions stored within downhole simulator 110 in accordance with the exemplary embodiments described herein, may be stored in storage 104 or some other computer-readable medium.

Although not explicitly shown in FIG. 1, it will be recognized that downhole simulation system 100 may be connected to one or more public and/or private networks via appropriate network connections. It will also be recognized that the software instructions comprising downhole simulator 110 may also be loaded into storage 104 from a CD-ROM or other appropriate storage media via wired or wireless means.

FIG. 1 further illustrates a block diagram of downhole simulator 110 according to an exemplary embodiment of the present invention. As will be described below, downhole simulator 110 comprises drilling prediction module 112, production prediction module 114, casing stress module 116, tubing stress module 118, and multi-string module 120. Based upon the input variables as described below, the algorithms of the various modules combine to formulate the wellhead analysis workflow of the present invention.

Drilling prediction module 112 simulates, or models, drilling events and the associated well characteristics such as the drilling temperature and pressure conditions present downhole during logging, trip pipe, casing, and cementing operations. Production prediction module 114 models production events and the associated well characteristics such as the production temperature and pressure conditions present downhole during circulation, production, and injection operations. Casing stress module 116 models the stresses caused by the loads generated by changes from the initial to final temperature and pressure conditions affecting the casing. Tubing stress module 118 simulates the stresses caused by the loads generated by changes from the initial to final temperature and pressure conditions affecting the tubing. The modeled data received from the foregoing modules is then fed into multi-string module 120 which analyzes and then models the annular fluid expansion and wellhead movement present in a system defined by the original input variables. Persons ordinarily skilled in the art having the benefit of this disclosure realize there are a variety modeling algorithms that could be employed to achieve the results of the foregoing modules.

Figure 2:
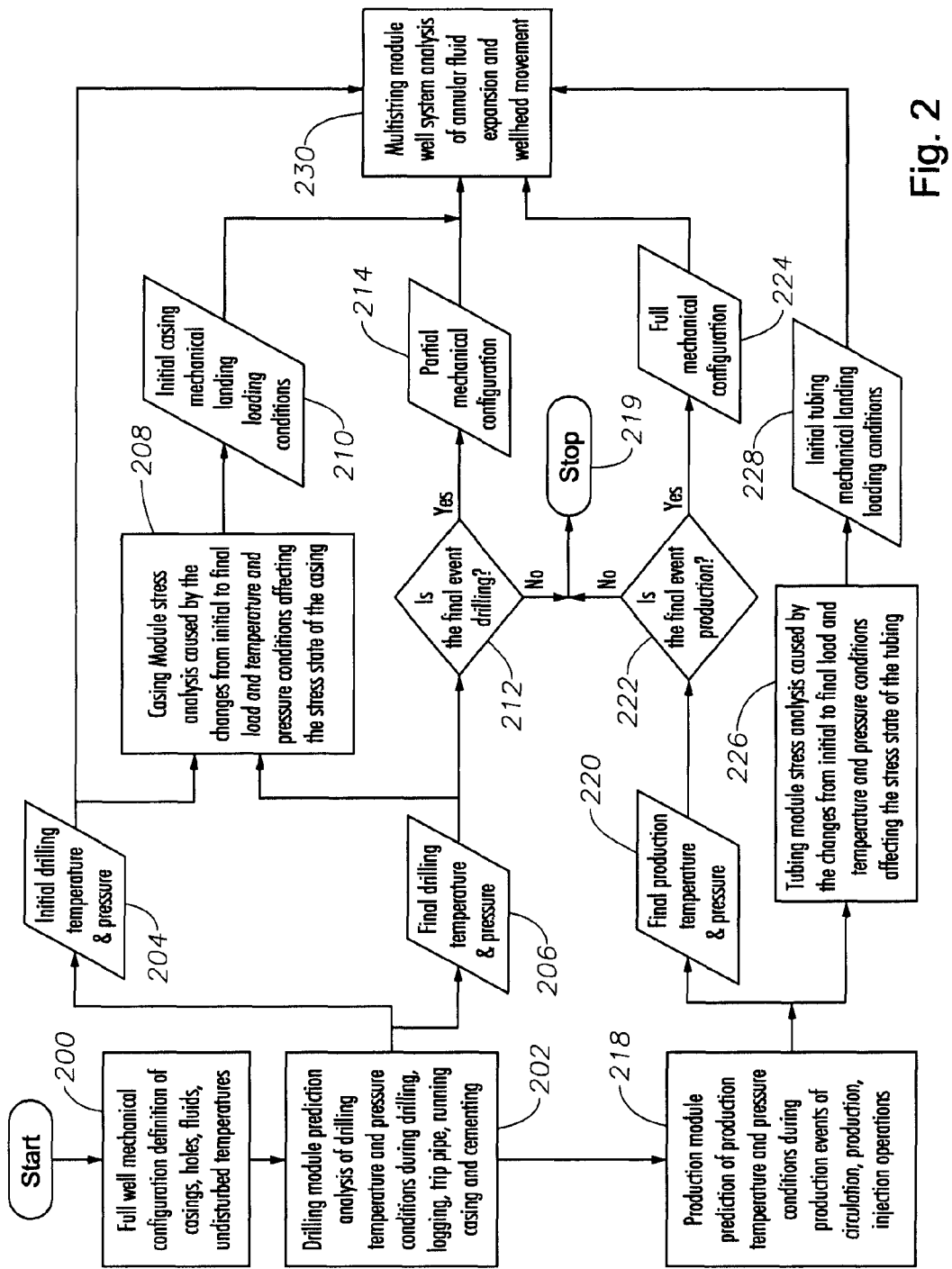
FIG. 2 is a flow chart illustrating data flow associated with an exemplary methodology of the present invention.

FIG. 2 illustrates the data flow of downhole simulation system 100 according to an exemplary methodology of the present invention. At step 200, the mechanical configuration of the well is defined using manual or automated means. For example, a user may input the well variables via I/O device 106 and display 108. However, the variables may also be received via network communication module 105 or called from memory by processor 102. In this exemplary embodiment, the input variables define the well configuration such as, for example, number of strings, casing and hole dimensions, fluids behind each string, cement types, and undisturbed static downhole temperatures. Based upon these input variables, at step 202, using drilling prediction module 112, processor 102 models the temperature and pressure conditions present during drilling, logging, trip pipe, casing, and cementing operations. At step 204, processor 102 then outputs the initial drilling temperature and pressure of the wellbore.

Further referring to FIG. 2, at step 206, processor 102 outputs the "final" drilling temperature and pressure. Here, "final" can also refer to the current drilling temperature and pressure of the wellbore if the present invention is being utilized to analyze the wellbore in real time. If this is the case, the "final" temperature and pressure will be the current temperature and pressure of the wellbore during that particular stage of drilling operation sought to be simulated. Moreover, the present invention could be utilized to model a certain stage of the drilling or other operation. If so, the selected operational stage would dictate the "final" temperature and pressure.

The initial and final drilling temperature and pressure values are then fed into casing stress module 116, where processor 102 simulates the stresses on the casing strings caused by loads generated by changes from the initial to final temperature and pressure conditions affecting those casing strings, at step 208. At step 210, processor 102 then outputs the initial casing mechanical landing loading conditions to multi-string module 120 (step 230). Referring back to step 206, the final drilling temperature and pressure has been determined. Thereafter, at step 212, processor 102 then determines whether the final event desired to be modeled, entered via interface 106,108, is a drilling operation. If the answer is "yes", processor 102 then computes that a partial mechanical configuration was selected at step 214, and the most current, or final, drilling temperature and pressure data (step 206) is outputted to multi-string module 120 (step 230). However, if the answer is "no", processor 102 then computes that the desired simulation is not a drilling operation, and this portion of the algorithm stops at step 219.

Still referring to the exemplary methodology of FIG. 2, back at step 202, processor 102 has modeled the drilling temperature and pressure conditions present during drilling, logging, trip pipe, casing, and cementing operations. Thereafter, at step 218, these variables are fed into production prediction module 114, where processor 102 simulates production temperature and pressure conditions during operations such as circulation, production, and injection operations. At step 220, processor determines the final production temperature and pressure based upon the analysis at step 218. At step 222, processor 102 then determines whether the desired event to be simulated is a production event. If the answer is "yes", processor 102 then computes that a full mechanical configuration of the well is to be simulated at step 224, and all the simulated data is inputted to multi-string module 120 (step 230). However, if the answer is "no", this portion of the algorithm stops at step 219.

Referring back to step 218, after the production temperature and pressure conditions have been modeled, the data is fed into tubing stress module 118 at step 226. Here, processor 102 simulates the tubing stresses caused by loads generated by changes from the initial to final temperature and pressure conditions affecting the stress state of the tubing. Thereafter, at step 228, processor 102 outputs the initial tubing mechanical landing loading conditions at step 228, and this data is fed into multi-string module 120 (step 230). At step 230, now that all necessary data has been fed into multi-string module 120, the final (or most current) well system analysis and simulation is performed by processor 102 in order to determine the annular fluid expansion (i.e., trapped annular pressures) and wellhead movement. Accordingly, the methodology illustrated in FIG. 2 may be used to simulate both complete and partial well designs as desired, even in real-time through linkage of final thermal operating conditions to drilling events.

Also note that the exemplary methodology described in FIG. 2 can involve different work flows as illustrated therein. For example, once the initial and final drilling temperatures/pressure have been determined at steps 204 & 206, they may be fed into multi-string module 120 at step 230 in order to determine the trapped annular pressures. Accordingly, persons ordinarily skilled in the art having the benefit of this disclosure realize there are workflows other than the one previously described that could be performed using the present invention.

As previously described, to conduct a multi-string analysis using exemplary embodiments of the present invention, the drilling and production operations are first defined in order to establish the casing and tubing initial and final temperature conditions, respectively, for each string. As such, exemplary embodiments of the present invention provides an application user interface that links final/current thermal and pressure operating conditions to drilling and production scenarios.

Figure 3A:
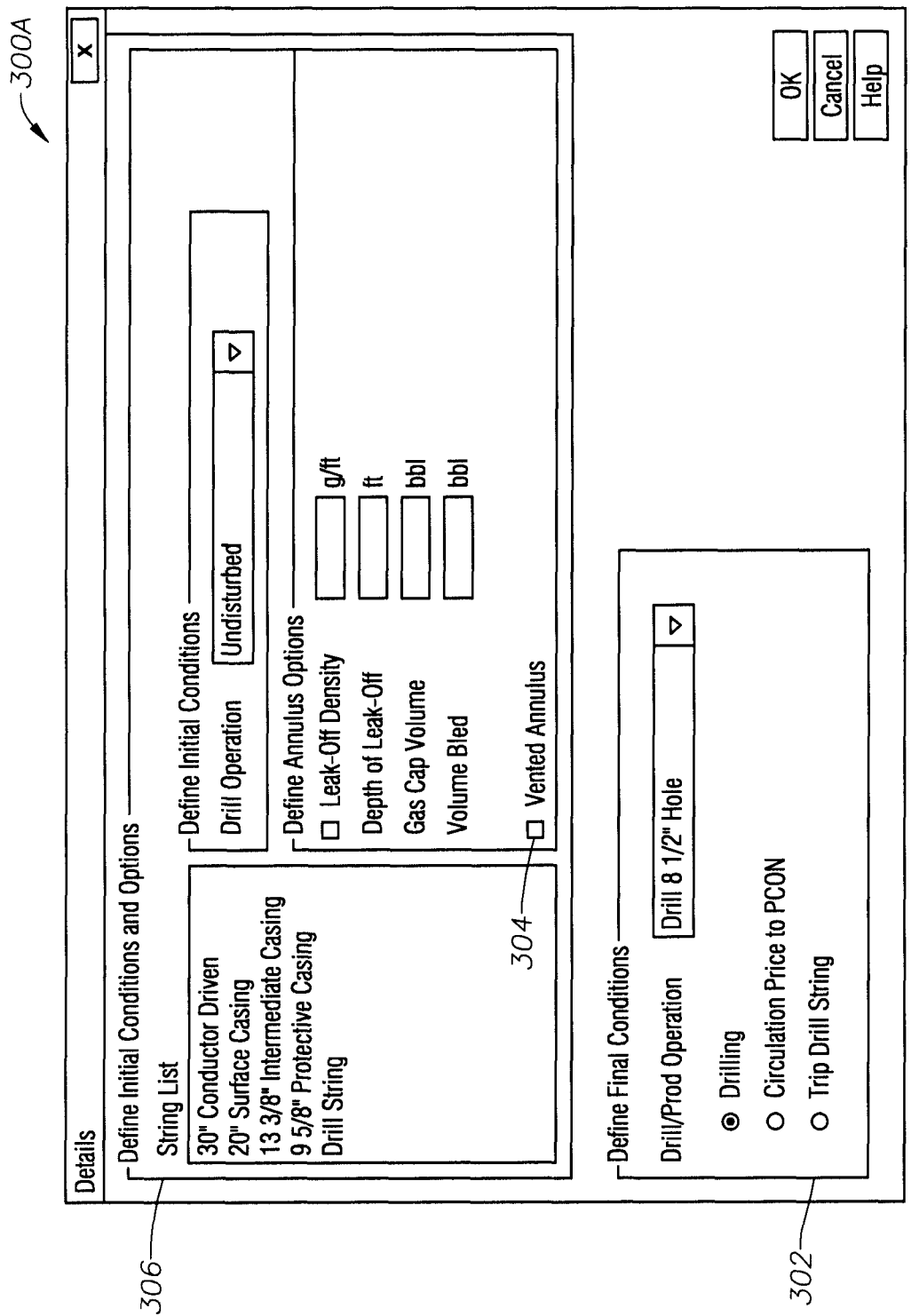
FIGS. 3A & 3B are screen shots of initial and final trapped annular pressure conditions and wellhead movement load history windows according to an exemplary embodiment of the present invention.
Figure 3B:
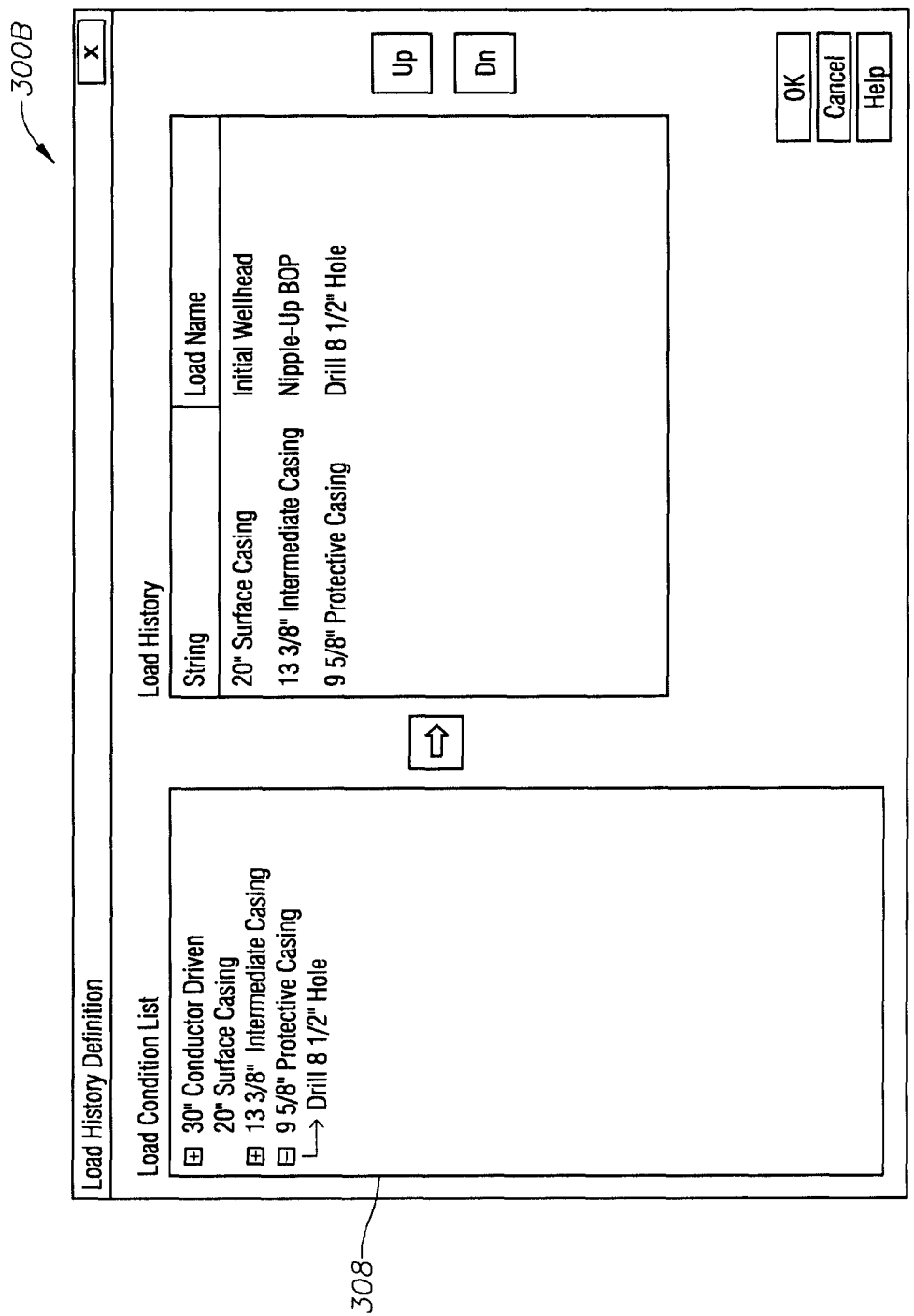

In an exemplary embodiment of the present invention, when a drilling operation is the desired event to the modeled, a list of calculated drilling operations (calculated by drilling prediction module 112 at step 202) are displayed in a final conditions dropdown list in the interface 300 of FIGS. 3A & 3B. Interface 300A, also referred to as a multi-string module annular fluid expansion details log, is utilized to select a list of calculated drilling operations from which trapped annular pressures along the well are modeled. As shown, there is a window 306 to define the initial conditions and options such as the strings, initial drilling operations, and annulus options. In addition, drilling, circulation, pull out of hole ("POOH"), displaced cement, and wait on cement partial drilling periods, etc., may be selected for each drilled interval. Window 302 allows selection of the final conditions, which can be a variety of stages such as, for example, drilling, circulation prior to POOH, trip drill string, or other drilling operations. Interface 300B, also referred to as a multi-string module wellhead movement details log, is utilized to select a list of calculated drilling operations from which wellhead movements are modeled. A load conditions window is utilized define the load characteristics of the well, as illustrated.

Exemplary embodiments of the present invention also provide iterative dependency logic between the number of strings present in the well during the drilling event selected, initial conditions, and final conditions. For example, if the final condition 302 selected via interface 300A is a drilling operation, the corresponding drill pipe used during the drilling event is included in the current list of strings present in the wellbore during the drilling event; thus, allowing for a real-time simulation of the well. If such a drilling event were selected, a vented annulus condition 304 (for the flow path associated to the drilling event) could be assumed by downhole simulation system 100 for purposes of a trapped annular pressure analysis. In the alternative, however, the final event selected can be a production event as well.

Figure 4A:
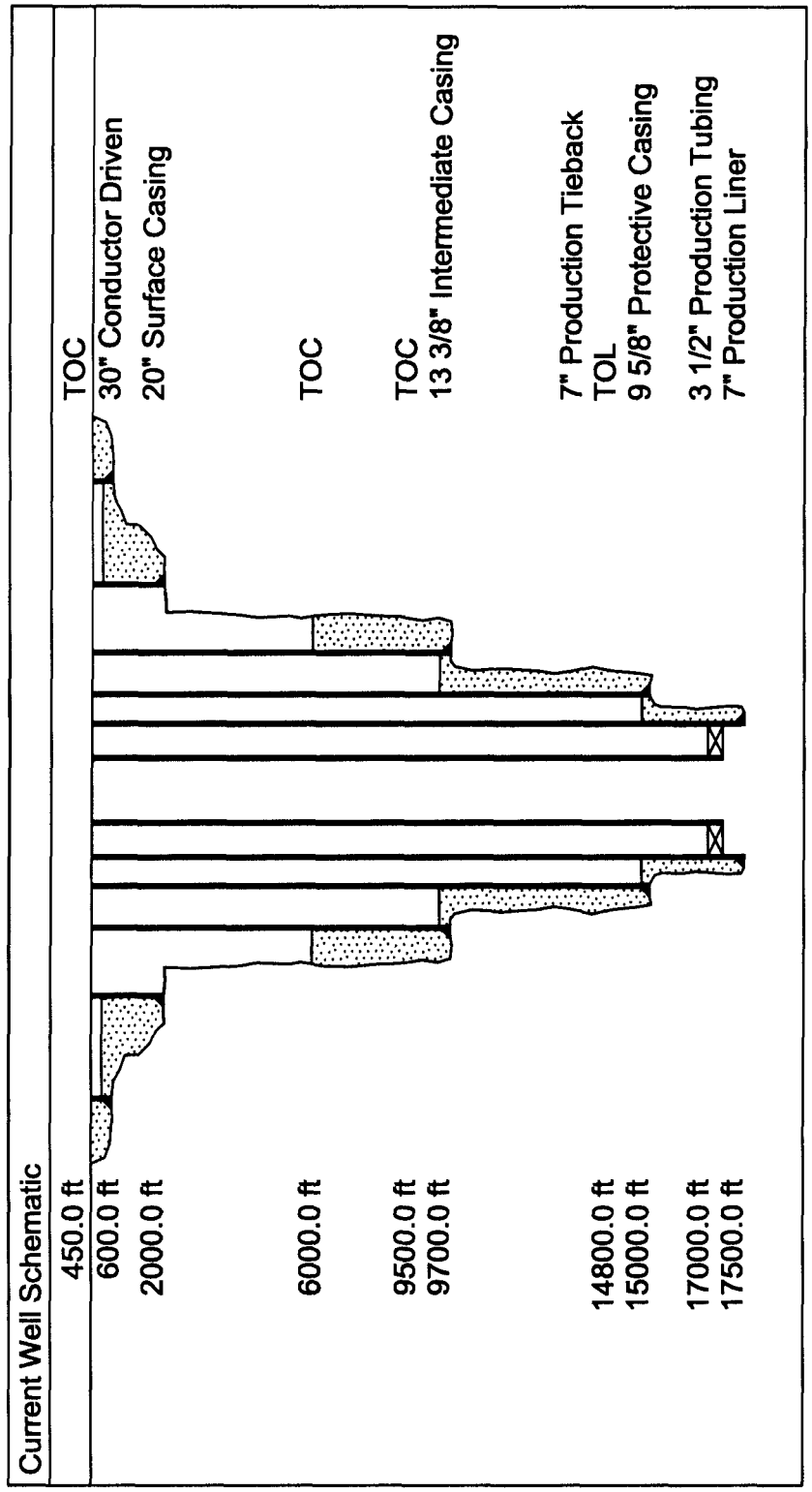
FIGS. 4A & 4B are screen shots illustrating full and partial wellbore configurations according to an exemplary embodiment of the present invention.
Figure 4B:
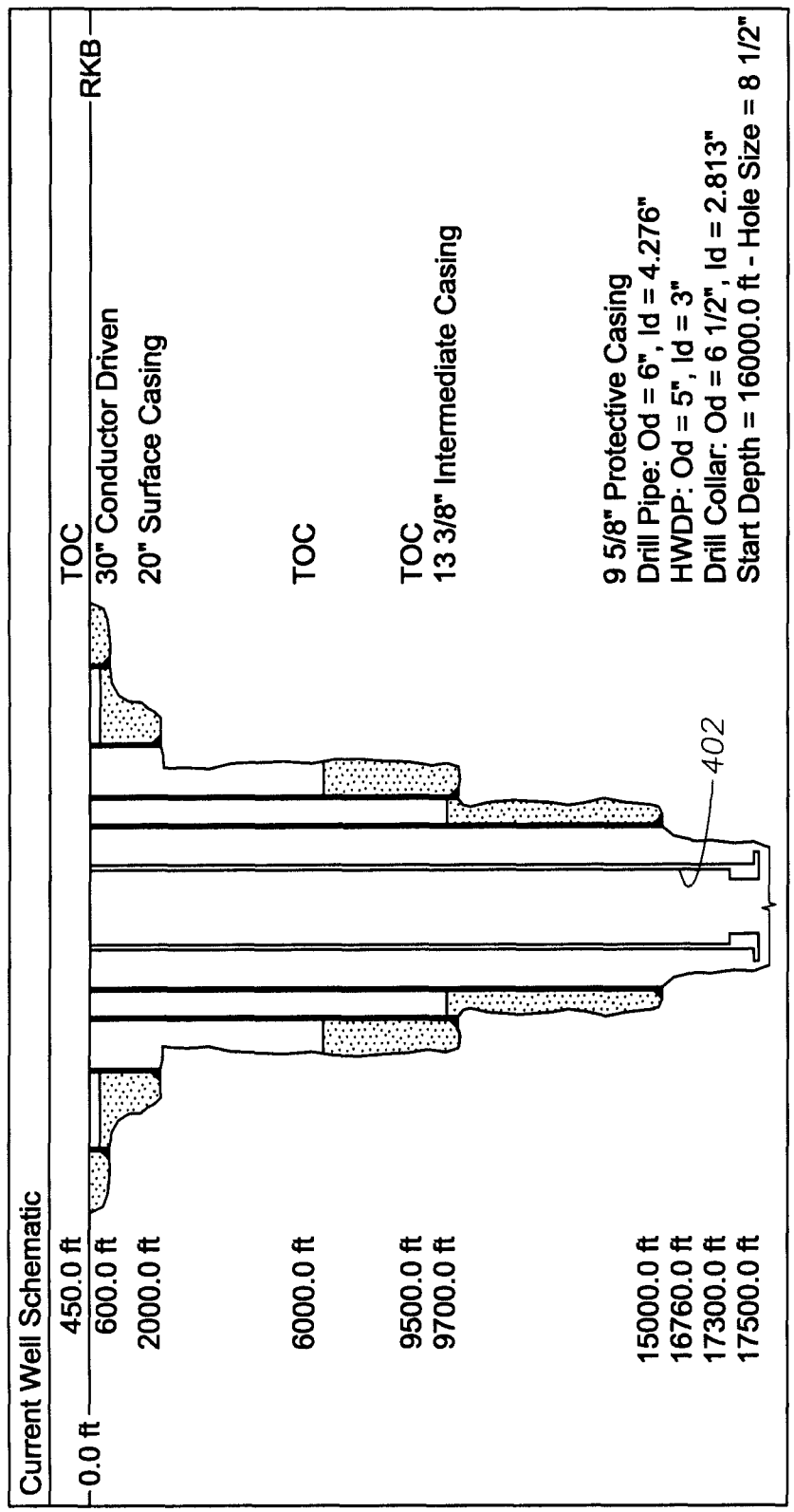

FIGS. 4A & 4B illustrate screen shots of a full and partial well configuration, respectively, according to exemplary embodiments of the present invention. Utilizing the displayed well schematic, either full or partial, the strings desired to be used in the calculation engine of simulator 110 are selected so that processor 102 can begin analysis of the corresponding data. Accordingly, at step 200, after selection of well configuration and loading conditions, the corresponding configuration is displayed as shown in FIGS. 4A or 4B. Here, the various strings, their configurations, and respective depths are illustrated.

In order to allow for modeling of partial well configurations such as that illustrated in FIG. 4B, exemplary embodiments of downhole simulator 110 include a workable indexing algorithm that removes the desired unnecessary pipes described in the full well configuration description (FIG. 4A), but not present in the wellbore during the final drilling event selected. To achieve this, downhole simulator 110 creates a well dynamically with all the strings used in the current operation. This dynamic well object contains the implementation to map the string indexes of the current operation to the full well configuration. When counting the strings for the input data feed to the engineering calculation engine utilized by simulator 110, processor 102 ignores the strings to be left out. Processor 102 follows a similar process to map the string inner diameters in the result file to the in-memory indexes. Consequently, processor 102 generates an input data file with the inner pipes properly removed with the help of the indexing algorithm determined earlier. The resultant input data file is logically consistent and usable by the engineering calculation engine (e.g., processor 102) to determine other variables including, for example, fluids, hangers, tensioners, slips, lock ring ratings, vented, volume bled, gas cap, leak off pressure, initial temperature, final temperature, annular fluid expansion initial pressure, final pressure, wellhead loads, and tensioner inputs, etc., as would be understood by one ordinarily skilled in the art having the benefit of this disclosure.

In instances when the final condition 302 is a drilling operation, the tubing/pressure data in the input files represents the drilling pipe. FIG. 4B illustrates such a representation in which tubing/pressure data in the input file would represent drill pipe 402. Also, in certain drilling events there is no drilling pipe in the open hole section (e.g., logging, etc.). As such, processor 102 ignores the presence of the string affecting engineering calculations of annular fluid expansion and wellhead movement.

In another exemplary embodiment of the present invention, the initial condition of drilling events will display the drilling intervals with applicable time periods in order to correctly apply temperature and pressure conditions of a drilling period within a drilling event. If the final operation is drilling, the mechanical configuration related to the final drilling event considered by processor 102 is displayed showing the irrelevant inner strings removed (FIG. 4B).

FIG. 5A illustrates a tabular multi-string annular fluid expansion drilling event summary 500 produced according to an exemplary embodiment of the present invention, as displayed on display 108. The table reports for each annulus affected by trapped annular pressure the amount of incremental AFE (annular fluid expansion) pressure as well as the associated incremental volume, per region (a string annulus can be subdivided into isolated annulus regions) per string annulus. Also, in FIG. 5A, downhole simulation system 100 reports the multistring wellhead movement displacement drilling event summary, with details of wellhead displacement results (incremental per load and cumulative).

Figure 5B:
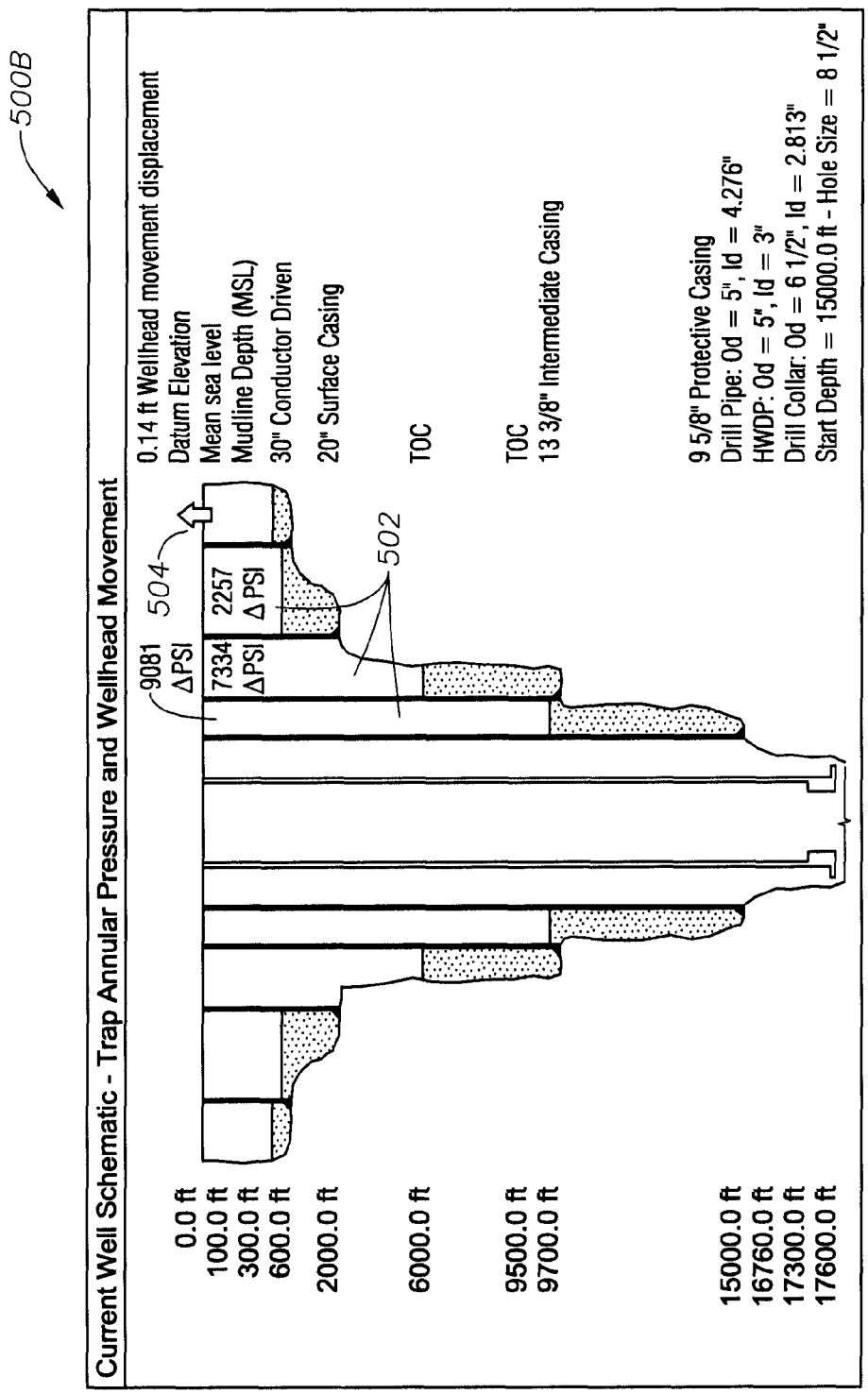
FIG. 5B illustrates tabular results of FIG. 5A in graphical form according to an exemplary embodiment of the present invention.

FIG. 5B illustrates the tabular results of FIG. 5A in graphical form, displayed on display 108, for easy visualization according to an exemplary embodiment of the present invention. As shown, pressures 502 illustrate the trapped annular pressures for each annulus, and arrow 504 denotes the wellhead displacement.

Accordingly, exemplary embodiments of the present invention may be utilized to conduct a total well system analysis during the design phase or in real-time. It can also be used to analyze the influence of the thermal expansion of annulus fluids, and/or the influence of loads imparted on the wellhead during the life of the well, as well as the load effects on the integrity of a well's tubulars. The present invention further determines the pressures due to the expansion of annular fluids and the position (e.g., displacement) of the wellhead during drilling operations. Accordingly, the load pressures and associated wellhead displacement values are used to determine the integrity of a defined set of well tubulars in the completed well or during drilling operations.

Although various embodiments and methodologies have been shown and described, the invention is not limited to such embodiments and methodologies and will be understood to include all modifications and variations as would be apparent to one skilled in the art. Therefore, it should be understood that the invention is not intended to be limited to the particular forms disclosed. Rather, the intention is to cover all modifications, equivalents and alternatives falling within the spirit and scope of the invention as defined by the appended claims.

What is claimed is:

1. A computer-implemented method to simulate drilling conditions along a wellbore, the method comprising:
    (a) using a computer, determining an initial drilling temperature and pressure condition of the wellbore;
    (b) using the computer, determining a final drilling temperature and pressure condition of the wellbore;
    (c) using the computer, determining at least one trapped annular pressure of the wellbore based upon the initial and final drilling temperature and pressure conditions; and
    (d) using the computer, simulating the at least one trapped annular pressure the wellbore during a drilling operation.

2. A computer-implemented method as defined in claim 1, further comprising:
    determining a wellhead movement present in the wellbore during the drilling operation; and
    simulating the wellhead movement.

3. A computer-implemented method as defined in claim 1, wherein the final drilling temperature and pressure condition of the wellbore is a current drilling temperature and pressure condition of the wellbore present during the drilling operation.

4. A computer-implemented method as defined in claim 1, wherein step (b) further comprises receiving an input reflecting a drilling operation as a final characteristic of the wellbore.

5. A computer-implemented method as defined in claim 1, wherein step (a) further comprises receiving an input reflecting an initial characteristic of the wellbore.

6. A system comprising processing circuitry to simulate drilling conditions along a wellbore, the processing circuitry performing the method comprising:
    determining an initial drilling temperature and pressure condition of the wellbore;
    determining a final drilling temperature and pressure condition of the wellbore;
    determining at least one trapped annular pressure of the wellbore based upon the initial and final drilling temperature and pressure conditions; and
    simulating the at least one trapped annular pressure of the wellbore during a drilling operation.

7. A system as defined in claim 6, further comprising:
    determining a wellhead movement present in the wellbore during the drilling operation; and
    simulating the wellhead movement.

8. A system as defined in claim 6, wherein the final drilling temperature and pressure condition of the wellbore is a current drilling temperature and pressure condition of the wellbore present during the drilling operation.

9. A system as defined in claim 6, wherein determining a final drilling temperature and pressure condition of the wellbore further comprises receiving an input reflecting a drilling operation as a final characteristic of the wellbore.

10. A system as defined in claim 6, wherein determining an initial drilling temperature and pressure condition of the wellbore further comprises receiving an input reflecting an initial characteristic of the wellbore.

11. A system as defined in claim 6, wherein the trapped annular pressure is simulated using a partial well configuration.

12. A non-transitory computer readable medium comprising instructions which, when executed by at least one processor, causes the processor to perform a method comprising:
   (a) determining an initial drilling temperature and pressure condition of the wellbore;
   (b) determining a final drilling temperature and pressure condition of the wellbore;
   (c) determining at least one trapped annular pressure of the wellbore based upon the initial and final drilling temperature and pressure conditions; and
   (d) simulating the at least one trapped annular pressure the wellbore during a drilling operation.

13. A computer readable medium as defined in claims 12, further comprising:
   determining a wellhead movement present in the wellbore during the drilling operation; and
   simulating the wellhead movement.

14. A computer readable medium as defined in claim 12, wherein the final drilling temperature and pressure condition of the wellbore is a current drilling temperature and pressure condition of the wellbore present during the drilling operation.

15. A computer readable medium as defined in claim 12, wherein step (b) further comprises receiving an input reflecting a drilling operation as a final characteristic of the wellbore.

16. A computer readable medium as defined in claim 12, wherein step (a) further comprises receiving an input reflecting an initial characteristic of the wellbore.

17. A computer readable medium as defined in claim 12, wherein the trapped annular pressure is simulated using a partial well configuration.

18. A computer-implemented method to simulate conditions along a wellbore, the method comprising, using a computer, simulating trapped annular pressure along the wellbore, during a drilling operation, based upon at least one condition of the wellbore.

19. A computer-implemented method as defined in claim 18, wherein simulating the drilling operation further comprises determining wellhead movement of the wellbore during the drilling operation.

20. A computer-implemented method as defined in claim 18, wherein the at least one condition of the wellbore is at least one of an initial drilling temperature and pressure condition of the wellbore and a final drilling temperature and pressure condition of the wellbore.

21. A computer-implemented method as defined in claim 18, further comprising simulating the drilling operation in real-time.

22. A computer-implemented method as defined in claim 18, wherein the simulation reflects trapped annular pressure throughout the drilling operation.

23. A computer-implement method as defined in claim 1 or 18, wherein the trapped annular pressure is simulated using a partial well configuration.

* * * * *